(12) United States Patent
Tang et al.

(10) Patent No.: US 7,977,663 B2
(45) Date of Patent: Jul. 12, 2011

(54) SEMICONDUCTOR LIGHT-EMITTING DEVICE WITH A HIGHLY REFLECTIVE OHMIC-ELECTRODE

(75) Inventors: Yingwen Tang, Nanchang (CN); Li Wang, Jiang Xi (CN); Fengyi Jiang, Jiang Xi (CN)

(73) Assignee: Lattice Power (Jiangxi) Corporation, Nanchang (CN)

( * ) Notice: Subject to any disclaimer, the term of this patent is extended or adjusted under 35 U.S.C. 154(b) by 583 days.

(21) Appl. No.: 12/160,040

(22) PCT Filed: Mar. 26, 2008

(86) PCT No.: PCT/CN2008/000597
§ 371 (c)(1),
(2), (4) Date: Jul. 3, 2008

(87) PCT Pub. No.: WO2009/117849
PCT Pub. Date: Oct. 1, 2009

(65) Prior Publication Data
US 2011/0031472 A1     Feb. 10, 2011

(51) Int. Cl.
*H01L 33/04* (2010.01)
(52) U.S. Cl. ......................................................... 257/13
(58) Field of Classification Search .................. 257/116,
257/117, 432–437, 749, E33.056–E33.059,
257/E25.032, 13, 79–103, 918, E29.069–E29.071,
257/E29.245, E49.001–E49.004, E21.404;
438/51, 55, 64–68, 83, 98, 22–47, 669, 493,
438/503, 507, 956
See application file for complete search history.

(56) References Cited

U.S. PATENT DOCUMENTS

| 5,898,185 A * | 4/1999 | Bojarczuk et al. | 257/103 |
| 6,686,610 B2 * | 2/2004 | Sheu | 257/103 |
| 6,870,191 B2 * | 3/2005 | Niki et al. | 257/79 |
| 7,132,691 B1 * | 11/2006 | Tanabe et al. | 257/79 |
| 7,763,900 B2 * | 7/2010 | Lee | 257/88 |
| 7,872,271 B2 * | 1/2011 | Seong et al. | 257/98 |
| 2003/0160229 A1 * | 8/2003 | Narayan et al. | 257/14 |
| 2004/0026704 A1 * | 2/2004 | Nikolaev et al. | 257/82 |
| 2005/0110037 A1 | 5/2005 | Takeda | |
| 2005/0133797 A1 | 6/2005 | Seong | |
| 2007/0102711 A1 * | 5/2007 | Aoyagi et al. | 257/79 |
| 2007/0257269 A1 * | 11/2007 | Cho et al. | 257/95 |
| 2008/0121914 A1 * | 5/2008 | Seong et al. | 257/98 |
| 2008/0191233 A1 * | 8/2008 | Yang et al. | 257/98 |
| 2008/0315229 A1 * | 12/2008 | Yi et al. | 257/98 |

* cited by examiner

*Primary Examiner* — Dao Nguyen
*Assistant Examiner* — Tram H Nguyen
(74) *Attorney, Agent, or Firm* — Park, Vaughan, Fleming & Dowler LLP; Shun Yao

(57) ABSTRACT

A semiconductor light-emitting device includes a multilayer semiconductor structure on a conductive substrate. The multilayer semiconductor structure includes a first doped semiconductor layer situated above the conductive substrate, a second doped semiconductor layer situated above the first doped semiconductor layer, and/or an MQW active layer situated between the first and second doped semiconductor layers. The device also includes a reflective ohmic-contact metal layer between the first doped semiconductor layer and the conductive substrate, which includes Ag, and at least one of: Ni, Ru, Rh, Pd, Au, Os, Ir, and Pt; plus at least one of: Zn, Mg Be, and Cd; and a number of: W, Cu, Fe, Ti, Ta, and Cr. The device further includes a bonding layer between the reflective ohmic-contact metal layer and the conductive substrate, a first electrode coupled to the conductive substrate, and a second electrode coupled to the second doped semiconductor layer.

16 Claims, 3 Drawing Sheets

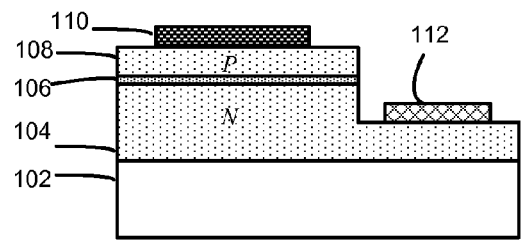
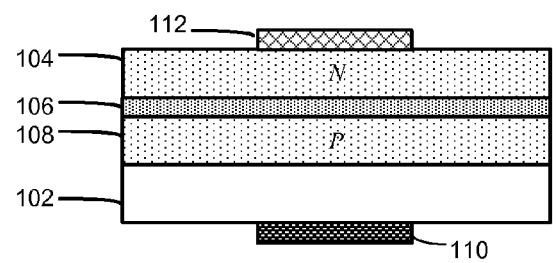
FIG. 1A  FIG. 1B
(PRIOR ART)
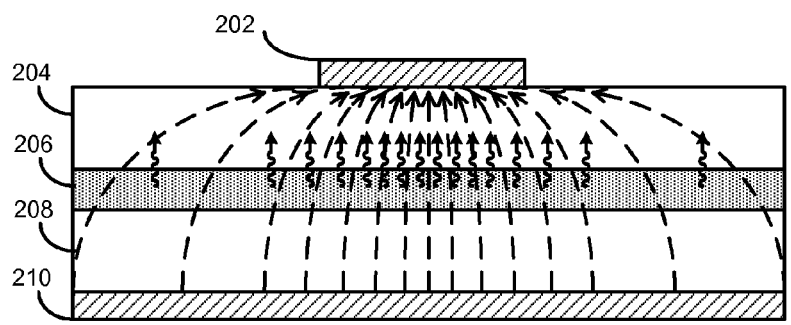
FIG. 2
(PRIOR ART)

SEMICONDUCTOR LIGHT-EMITTING DEVICE WITH A HIGHLY REFLECTIVE OHMIC-ELECTRODE

RELATED APPLICATION

This application is a national-stage application of and hereby claims priority under 35 U.S.C. §120, §365(c), and §371 to PCT Application No PCT/CN2008/000597, filed 26 Mar. 2008.

BACKGROUND

1. Field of the Invention

The present invention relates to the design of semiconductor light-emitting devices. More specifically, the present invention relates to novel semiconductor light-emitting devices with highly reflective ohmic-electrodes.

2. Related Art

Solid-state lighting is expected to bring the next wave of illumination technologies. High-brightness light-emitting diodes (HB-LEDs) are emerging in an increasing number of applications, from serving as the light source for display devices to replacing light bulbs for conventional lighting. Typically, cost, efficiency, and brightness are the three foremost metrics for determining the commercial viability of LEDs.

An LED produces light from an active region, which is "sandwiched" between a positively doped layer (p-type doped layer) and a negatively doped layer (n-type doped layer). When the LED is forward-biased, the carriers, which include holes from the p-type doped layer and electrons from the n-type doped layer, recombine in the active region. In direct band-gap materials, this recombination process releases energy in the form of photons, or light, whose wavelength corresponds to the energy band-gap of the material in the active region.

Depending on the selection of the substrate and the design of the semiconductor layer stack, an LED can be formed using two configurations, namely the lateral-electrode (electrodes are positioned on the same side of the substrate) configuration and the vertical-electrode (electrodes are positioned on opposite sides of the substrate) configuration. FIGS. 1A and 1B illustrate both configurations, where FIG. 1A shows the cross-section of a typical lateral-electrode LED and FIG. 1B shows the cross-section of a typical vertical-electrode LED. Both of the LEDs shown in FIGS. 1A and 1B include a substrate layer 102, an n-type doped layer 104, an optional multi-quantum-well (MQW) active layer 106, a p-type doped layer 108, a p-side electrode 110 coupled to the p-type doped layer, and an n-side electrode 112 coupled to the n-type doped layer.

The vertical-electrode configuration makes the packaging of the device easier. In addition, because the electrodes are located on opposite sides of the device, the device is more resistant to electrostatic discharge. Therefore, a vertical-electrode LED has a higher stability compared with a lateral-electrode LED. This is especially true for high-power short-wavelength LEDs.

In order to extract light effectively from a high-power high-brightness LED, a flip-chip packaging technique is often adopted, in which the p-side electrode is used as a highly reflective surface to reflect light to the opposite side of the device. The presence of a light reflector increases the light extraction efficiency of the LED. FIG. 2 illustrates an exemplary structure of a flip-chip packaged vertical LED with the p-electrode as a reflector. From the top down, FIG. 2 shows an n-side electrode 202, an n-type doped layer 204, an active layer 206, a p-type doped layer 208, and a p-side electrode 210, which also acts as a reflector. The arrows in dashed lines show the direction of the current flow, and the short arrows pointing upward show the direction of the light propagation. Note that unlike laser devices, in which emitted light is guided and propagates in a well-defined direction, the light emitted in an LED propagates omni-directionally. Hence, the reflector at the bottom of the device is essential in increasing the light extraction efficiency.

SUMMARY

One embodiment of the present invention includes a semiconductor light-emitting device which includes a multilayer semiconductor structure on a conductive substrate. The multilayer semiconductor structure includes a first doped semiconductor layer situated above the conductive substrate, a second doped semiconductor layer situated above the first doped semiconductor layer, and/or a multi-quantum-wells (MQW) active layer situated between the first and second doped semiconductor layers. The device also includes a reflective ohmic-contact metal layer situated between the first doped semiconductor layer and the conductive substrate. The reflective ohmic-contact metal layer includes Ag, and at least one of the following materials: Ni, Ru, Rh, Pd, Au, Os, Ir, and Pt; plus at least one of the following materials: Zn, Mg, Be, and Cd; and a number of the following materials: W, Cu, Fe, Ti, Ta, and Cr. The device further includes a bonding layer situated between the reflective ohmic-contact metal layer and the conductive substrate, a first electrode coupled to the conductive substrate, and a second electrode on the second doped semiconductor layer.

In a variation on this embodiment, the first doped semiconductor layer is a p-type doped semiconductor layer.

In a further variation on this embodiment, the p-type doped semiconductor layer includes GaN doped with Mg.

In a variation on this embodiment, the reflective ohmic-contact metal layer includes one of the following metal compositions: Ag/Pt/Mg alloy and Ag/Pt/Zn alloy.

In a variation on this embodiment, the reflective ohmic-contact layer includes by weight 1-10% of at least one of the following materials: Pt, Ni, Ru, Rh, Pd, Au, Os, and Ir; 0.001-5% of at least one of the following materials: Zn, Mg, Be, and Cd; and 0-5% of a number of the following materials: W, Cu, Ti, Ta, and Cr.

In a variation on this embodiment, the reflective ohmic-contact layer includes by weight 97% of Ag, 1.5% of Pt, and 1.5% of Zn.

In a variation on this embodiment, the active layer includes at least one of the following materials: InGaN, InGaAlN, InGaAlP, and InGaAlAs.

In a variation on this embodiment, the conductive substrate includes at least one of the following materials: Si, GaAs, GaP, Cu, and Cr.

BRIEF DESCRIPTION OF THE FIGURES

FIG. 1A illustrates the cross-section of an exemplary lateral-electrode LED.

FIG. 1B illustrates the cross-section of an exemplary vertical-electrode LED.

FIG. 2 illustrates the cross-section of an exemplary vertical-electrode LED using p-side electrode as a reflector.

DETAILED DESCRIPTION

Figure 3A:
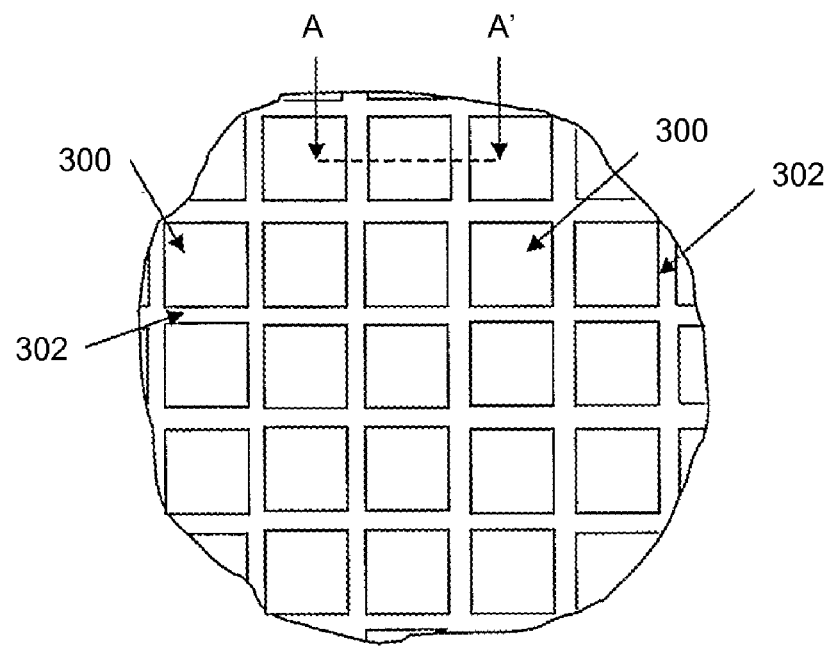
FIG. 3A illustrates part of a substrate with pre-patterned grooves and mesas in accordance with one embodiment.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

Overview

The recent developments in LED fabrication technology enable the use of GaN-based III-V compound semiconductors, which include AlGaN, InGaN, InGaAlN, and GaN, as materials for short-wavelength LED. These GaN-based LEDs not only extend the LED emission spectrum to the green, blue, and ultraviolet region, but also can achieve high light emission efficiency. In order to avoid the problem of current crowdedness, and to increase the light extraction efficiency, it is necessary to choose a highly reflective material as the contact layer for the p-side ohmic-electrode.

There exist only a few kinds of metal materials, such as silver (Ag) and aluminum (Al), which can provide high reflection to light whose spectrum ranges from green to violet. However, it is very difficult for Ag or Al to form a good ohmic-contact with p-type doped GaN-based compound semiconductors, such as p-GaN, p-AlGaN, p-InGaN, and p-InGaAlN. On the other hand, metal materials, such as platinum (Pt), palladium (Pd), and nickel/gold (Ni/Au) alloy, which can form a low-resistance ohmic-contact with the aforementioned p-doped GaN semiconductors strongly absorb light in the desired spectrum range. Note that the thicker the metal contact, the stronger the light absorption. Thus, it becomes desirable to reduce the thickness of the ohmic-electrode to reduce light absorption. Still, the absorption induced by a thin layer of metal can significantly reduce the light extraction efficiency. In addition, the absorbed light energy often converts to heat, which can cause the LED temperature to rise. The increased temperature in turn may lead to stronger light absorption and increased leakage current, which tends to shorten the LED lifetime, or, in the worst case, causes the LED to burn out. It has been shown that, when an LED is working under a large bias, the heat generated by electrodes is one of the main factors that shorten the LED lifetime.

Recently, researchers have adopted a method that uses transparent-conductive-oxide (TCO) materials to form the p-side ohmic-contact. However, TCO materials may not be suitable for high power LEDs, because the relatively high contact resistance and low heat conductivity of the TCO material can lead to heat accumulation inside the LED and may also increase LED leakage current.

At present, highly reflective p-electrodes are typically based on Ni/Au/Ag alloy, Ag plated TCO, and nickel/silver/ruthenium (Ni/Ag/Ru) alloy. All of these materials are associated with certain problems. Although the contact resistance for the Ni/Au/Ag electrode is relatively low, the gold layer strongly absorbs the emitted light. For instance, the Ni/Au/Ag electrode can absorb about 20-30% of light whose wavelength is in the 460 nm region. Such a high light-absorption-rate greatly decreases the light extraction efficiency of the LED. If one wishes to reduce light absorption by reducing the thickness of the Ni/Au layer, then he will face the problem of a non-ideal ohmic-contact along with weakened adhesion. On the other hand, the Ag-plated TCO electrode demonstrates higher light extraction efficiency, but its low heat conductivity leads to heat accumulation, thus making the LED less stable under high bias current. Furthermore, although the Ni/Ag/Ru electrode exhibits lower light absorption because only a thin layer of Ni exists between the semiconductor and the Ag reflector, Ni is not suitable to form a good ohmic-contact with the p-doped GaN material. In addition, its annealing process often reduces the reflectivity of the Ag layer. Ag alone has demonstrated high reflectivity toward blue light but is difficult to form a good ohmic-contact with p-doped GaN material. In addition, the contact characteristic, stability, and adhesiveness of an Ag ohmic-contact are inferior to that of an ohmic-contact formed with Pt, Pd, or Ni/Au.

As stated above, it is difficult to satisfy all required conditions simultaneously, which include low light absorption, low contact resistance, high stability, and strong adhesion, to form a reliable, high-reflective, low-resistant ohmic-electrode for the high-brightness high-power LED.

Embodiments of the present invention provide an LED device with a highly reflective ohmic-electrode. The device includes a conductive substrate, a multilayer semiconductor structure, a reflective ohmic-contact metal layer, a bonding layer which bond the multilayer structure with the conductive substrate, a first electrode, and a second electrode. The reflective ohmic-contact metal layer includes Ag, and one or two other metal materials which include Mg and Zn.

Preparing Substrate

In order to grow a crack-free GaN-based III-V compound multilayer structure on a large-area growth substrate (such as a Si wafer), a growth method that pre-patterns the substrate with grooves and mesas is introduced. Pre-patterning the substrate with grooves and mesas can effectively release the stress in the multilayer structure that was caused by lattice-constant and thermal-expansion-coefficient mismatches between the substrate surface and the multilayer structure.

Figure 3B:
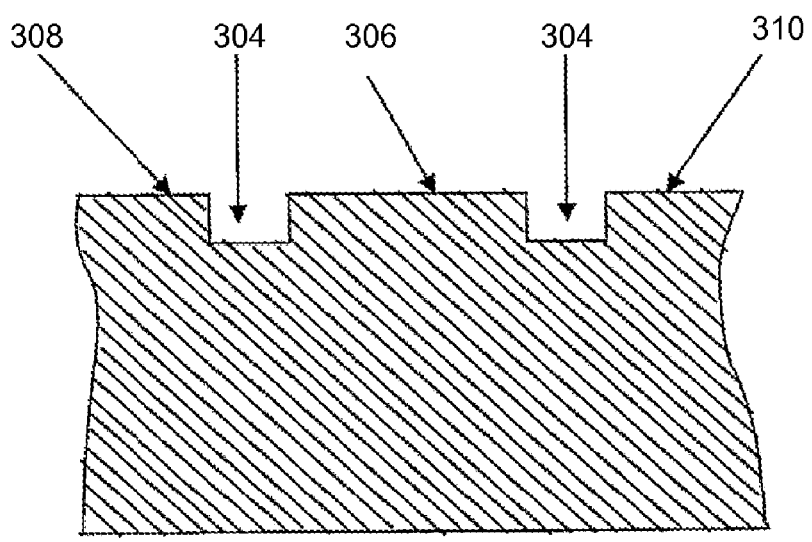
FIG. 3B illustrates the cross-section of the pre-patterned substrate in accordance with one embodiment.

FIG. 3A illustrates a top view of part of a substrate with a pre-etched pattern using photolithographic and plasma etching techniques in accordance with one embodiment. Square mesas 300 and grooves 302 are the result of etching. FIG. 3B more clearly illustrates the structure of mesas and grooves by showing a cross-section of the pre-patterned substrate along a horizontal line AA' in FIG. 3A in accordance with one embodiment. As seen in FIG. 3B, the sidewalls of intersecting grooves 304 effectively form the sidewalls of the isolated mesa structures, such as mesa 306, and partial mesas 308 and 310. Each mesa defines an independent surface area for growing a respective semiconductor device.

Note that it is possible to apply different lithographic and etching techniques to form the grooves and mesas on the semiconductor substrate. Also note that other than forming square mesas 300 as shown in FIG. 3A, alternative geometries can be formed by changing the patterns of grooves 302. Some of these alternative geometries can include, but are not limited to: triangle, rectangle, parallelogram, hexagon, circle, or other non-regular shapes.

Fabricating Light-Emitting Device with Highly Reflective Ohmic-Electrode

Figure 4:
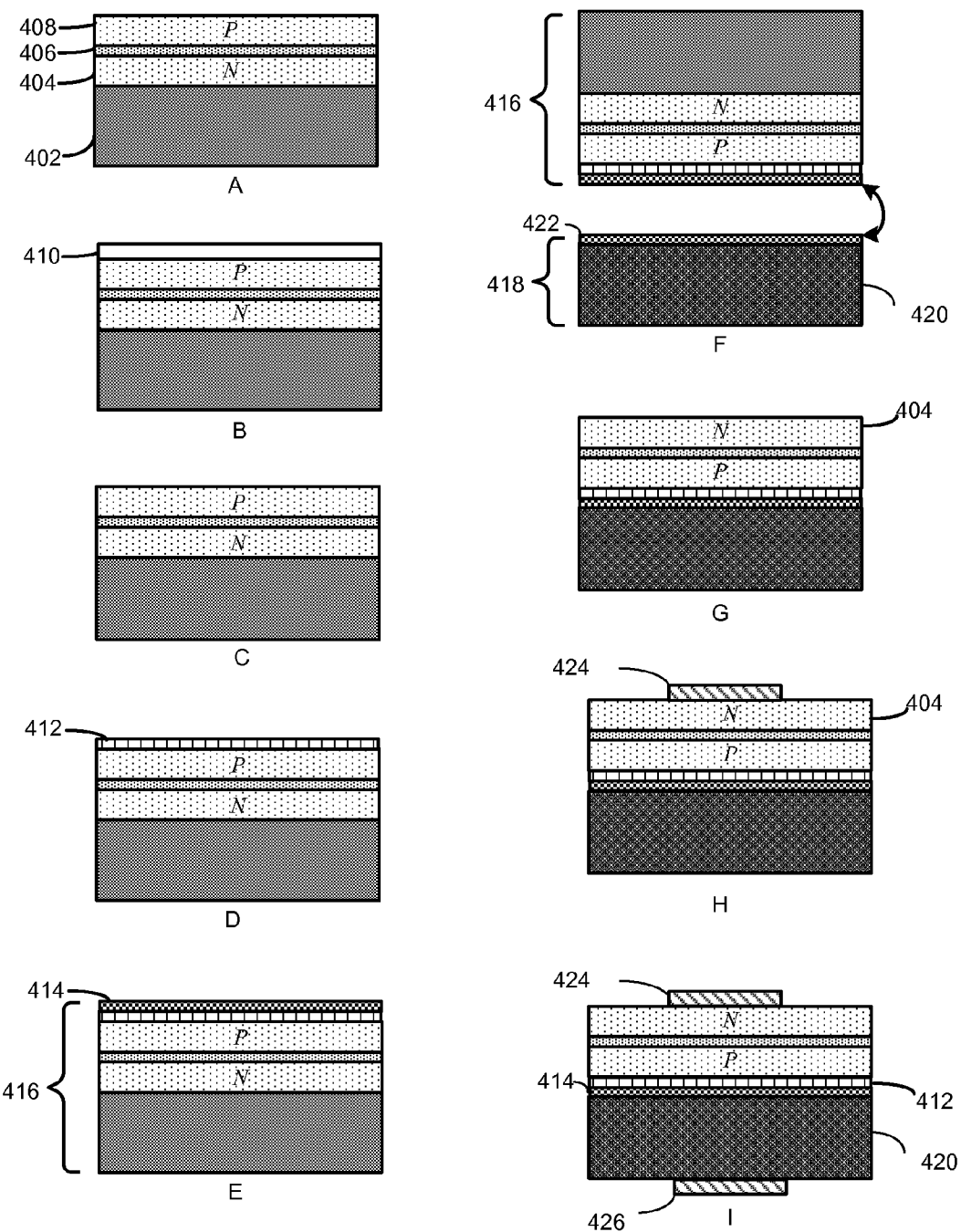
FIG. 4 presents a diagram illustrating the process of fabricating a light-emitting device with a highly reflective ohmic-electrode in accordance with one embodiment.

FIG. 4 presents a diagram illustrating the process of fabricating a light-emitting device with a highly reflective ohmic-electrode in accordance with one embodiment. In operation A, after a pre-patterned growth substrate with grooves and mesas is prepared, an InGaN multilayer structure is formed using various growth techniques, which can include, but are not limited to, metalorganic chemical vapor deposition (MOCVD). The LED structure can include a substrate layer 402, which can be a Si wafer, an n-type doped semiconductor layer 404, which can be a Si doped GaN layer, an active layer 406, which can be a multi-period GaN/InGaN MQW, and a p-type doped semiconductor layer 408, which may be based on Mg doped GaN. Note that it is possible to reverse the growth sequence between the p-type layer and the n-type layer.

In operation B, a contact-assist metal layer 410 is formed on the top of the p-doped semiconductor layer. The metal materials that can be used to form contact-assist metal layer 410 include platinum (Pt) and/or Ni. Contact-assist metal layer 410 can also include at least one of the following materials: ruthenium (Ru), rhodium (Rh), palladium (Pd), osmium (Os), iridium (Ir), beryllium (Be), zinc (Zn), and magnesium (Mg). Contact-assist metal layer 410 can be deposited using, for example, an evaporation technique, such as electro-beam (e-beam) evaporation, or a sputtering technique. Other deposition techniques are also possible. The thickness of contact-assist metal layer 410 is at least 10 angstroms. In one embodiment, the thickness of contact-assist metal layer 410 is approximately 500 angstroms.

In operation C, contact-assist metal layer 410 first undergoes a thermal-annealing procedure and is then removed using, for example, a mechanical grinding technique or a chemical etching technique. The thermal-annealing procedure activates the p-type ions in the p-type layer. The atmosphere for the thermal-annealing procedure may include one of the following: Nitrogen ($N_2$), Oxygen ($O_2$), air, vacuum, and inert gases. The temperature for the thermal annealing can be between 200° C. and 1000° C. In one embodiment, the thermal annealing temperature is approximately 550° C. The total time used for the thermal annealing may be between 10 seconds and 24 hours. In one embodiment, the thermal annealing lasts for approximately 5 minutes. The process of deposition, annealing, and removal of contact-assist metal layer 410 improves the ohmic-contact characteristic, and the adhesiveness as well as the stability of an ohmic-contact formed between selected metals and p-type layer 408.

In operation D, a reflective ohmic-contact metal layer 412 is formed on the top of p-type doped layer 408. The metal materials used to form reflective ohmic-contact metal layer 412 include Ag, at least one of the following materials: Ru, Rh, Pd, Au, Os, Ir, and Pt; plus at least one of: Zn, Mg, Cadmium (Cd), and Beryllium (Be); and a number of the following materials: Tungsten (W), Copper (Cu), Titanium (Ti), Tantalum (Ta), and Chromium (Cr). For better performance, the reflective ohmic-contact layer can be a Ag alloy containing by weight 1-10% of at least one of the following materials: Pt, Ru, Rh, Pd, Au, Os, Ir; 0.001-5% of at least one of: Zn, Mg, Cd, and Be; and 0-5% of one or more of the following materials: W, Cu, Ti, Ta, and Cr. Similarly to that of contact-assist metal layer 410, reflective ohmic-contact metal layer 412 can be deposited using an evaporation technique, such as electro-beam (e-beam) evaporation, or a sputtering technique. Other deposition techniques are also possible.

Among all available choices of metal materials/compositions for reflective ohmic-contact metal layer 412, one embodiment chooses a metal composition of Ag/Pt/Mg and another embodiment chooses that of Ag/Pt/Zn. As stated before, Ag is a good reflector for green and blue light. In addition, Pt has a relatively high work function. For p-type doped semiconductor material, it is ideal to have the work function of the electrode to be equal to or greater than that of the semiconductor material in order to form a high conductivity region. Thus, Pt is a desirable material for forming a low-resistance ohmic-contact with the p-doped semiconductor layer. In addition, the presence of Pt in the silver alloy effectively reduces the diffusion of the Ag ions into p-type layer 408. Furthermore, because Mg and Zn are both p-type dopants to III-V semiconductor compounds, such as GaN, when forming the ohmic-contact, these two metals can act like source of acceptors to increase the p-type doping concentration on, or in the vicinity of, the semiconductor surface. In addition, the presence of Mg and/or Zn in the silver alloy can effectively increase the thermal stability of the Ag alloy. Therefore, the choice of these two metal compositions (Ag/Pt/Mg, Ag/Pt/Zn) can result in a low-resistance ohmic-contact with good thermal stability and strong adhesion. In addition, this ohmic-contact is also highly reflective to blue light as needed by a short-wavelength LED. In one embodiment, reflective ohmic-contact metal layer 412 comprises by weight 97% Ag, 1.5% Pt, and 1.5% Zn.

It is optional to perform a thermal-annealing procedure after the formation of reflective ohmic-contact metal layer 412. If thermal annealing is performed, the annealing temperature can be between 200° C. and 1000° C. In one embodiment, the annealing temperature is approximately 550° C. The total time used for the annealing period can be between 5 seconds and 120 minutes. In one embodiment, the thermal annealing lasts for approximately 2 minutes. The annealing atmosphere can be one of the following: $N_2$, $O_2$, air, vacuum, and inert gases.

In operation E, a bonding layer 414 is formed on top of reflective ohmic-contact metal layer 412. Materials that are used to form bonding layer 414 may include gold.

In operation F, the multilayer structure 416 is flipped upside down to bond with a supporting structure 418. In one embodiment, supporting structure 418 includes a conductive substrate layer 420 and a bonding layer 422. Bonding layer 422 may include Au. Conductive substrate layer 420 includes at least one of the following materials: Si, GaAs, GaP, Cu, and Cr.

In operation G, growth substrate 402 is removed by, for example, a mechanical grinding technique, or a chemical etching technique. The removal of growth substrate 402 exposes n-type layer 404.

In operation H, an electrode 424 (the n-side electrode) is formed on top of n-type layer 404. In one embodiment, n-side electrode 424 includes Ni, Au, Au/Ge/Ni alloy, Ti, Al, Cr, and/or Ti/Al alloy. N-side electrode 424 can be formed using, for example, an evaporation technique, such as e-beam evaporation, or a sputtering technique. Other deposition techniques are also possible.

In operation I, another ohmic-contact 426 is formed at the backside of conductive substrate 420. The material composition and the formation process of ohmic-contact 426 can be similar to that for n-side electrode 424. Note that, ohmic-contact 426, conductive substrate 420, bonding layer 414, and reflective ohmic-contact metal layer 412 together form the highly reflective p-side electrode.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A semiconductor light-emitting device, comprising:
a multilayer semiconductor structure on a conductive substrate, the multilayer semiconductor structure comprising a first doped semiconductor layer situated above the conductive substrate, a second doped semiconductor layer situated above the first doped semiconductor layer, and/or a multi-quantum-wells (MQW) active layer situated between the first and second doped semiconductor layers;
a reflective ohmic-contact metal layer situated between the first doped semiconductor layer and the conductive substrate, wherein the reflective ohmic-contact metal layer comprises one of the following metal compositions:
Ag/Pt/Mg, and
Ag/Pt/Zn;
a bonding layer situated between the reflective ohmic-contact metal layer and the conductive substrate;
a first electrode coupled to the conductive substrate; and
a second electrode on the second doped semiconductor layer.

2. The semiconductor light-emitting device of claim 1, wherein the first doped semiconductor layer is a p-type doped semiconductor layer.

3. The semiconductor light-emitting device of claim 2, wherein the p-type doped semiconductor layer comprises GaN doped with Mg.

4. The semiconductor light-emitting device of claim 1, wherein the reflective ohmic-contact layer comprises by weight:
97% of Ag;
1.5% of Pt; and
1.5% of Zn.

5. The semiconductor light-emitting device of claim 1, wherein the MQW active layer comprises at least one of the following materials:
InGaN,
InGaAlN,
InGaAlP, and
InGaAlAs.

6. The semiconductor light-emitting device of claim 1, wherein the conductive substrate comprises at least one of the following materials:
Si,
GaAs,
GaP,
Cu, and
Cr.

7. A method for fabricating a semiconductor light-emitting device, the method comprising:
growing a multilayer semiconductor structure on a growth substrate, wherein the multilayer semiconductor structure comprises a first doped semiconductor layer, a second doped semiconductor layer, and/or a multi-quantum-wells (MQW) active layer;
forming a reflective ohmic-contact metal layer on the first doped semiconductor layer, wherein the reflective ohmic-contact metal layer comprises one of the following metal compositions:
Ag/Pt/Mg, and
Ag/Pt/Zn;
forming a bonding layer coupled to the reflective ohmic-contact metal layer;
bonding the multilayer structure to a conductive substrate;
removing the growth substrate;
forming a first electrode coupled to the conductive substrate; and
forming a second electrode on the second doped semiconductor layer.

8. The method of claim 7, wherein the growth substrate comprises a pre-defined pattern of grooves and mesas.

9. The method of claim 7, further comprising:
forming a contact-assist metal layer on the first doped semiconductor layer, wherein the contact-assist metal layer comprises Pt or a Pt alloy which includes at least one of the following materials: Ru, Rh, Pd, Os, Ir, Ni, Zn, and Mg;
annealing the multilayer structure to activate the first doped semiconductor layer; and
removing the contact-assist metal layer.

10. The method of claim 7, wherein the first doped semiconductor layer is a p-type doped semiconductor layer.

11. The method of claim 10, wherein the p-type doped semiconductor layer comprises GaN doped with Mg.

12. The method of claim 9, wherein the thickness of the contact-assist metal layer is at least 10 angstroms.

13. The method of claim 9, wherein temperature for the annealing process is between 200° C. and 1000° C.;
wherein the duration for the annealing process is approximately 5 minutes; and
wherein the annealing atmosphere comprises one of the following:
$N_2$,
$O_2$,
air,
vacuum, and
inert gases.

14. The method of claim 9, wherein the removal of the contact-assist metal layer involves chemical etching and/or mechanical grinding.

15. The method of claim 7, wherein the reflective ohmic-contact layer comprises by weight:
97% of Ag;
1.5% of Pt; and
1.5% of Zn.

16. The method of claim 7, wherein the conductive substrate comprises at least one of the following materials:
Si,
GaAs,
GaP,
Cu, and
Cr.

* * * * *